United States Patent
Weichslberger et al.

(10) Patent No.: US 9,462,701 B2
(45) Date of Patent: Oct. 4, 2016

(54) METHOD FOR MOUNTING A COMPONENT IN OR ON A CIRCUIT BOARD, AND CIRCUIT BOARD

(75) Inventors: Guenther Weichslberger, Graz (AT); Dietmar Drofenik, Spielberg (AT)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 333 days.

(21) Appl. No.: 13/988,385

(22) PCT Filed: Nov. 16, 2011

(86) PCT No.: PCT/AT2011/000464
§ 371 (c)(1),
(2), (4) Date: May 20, 2013

(87) PCT Pub. No.: WO2012/065202
PCT Pub. Date: May 24, 2012

(65) Prior Publication Data
US 2013/0233603 A1    Sep. 12, 2013

(30) Foreign Application Priority Data
Nov. 19, 2010 (AT) .................................... 709/2010

(51) Int. Cl.
*H05K 1/09* (2006.01)
*H05K 3/32* (2006.01)
(Continued)

(52) U.S. Cl.
CPC .............. *H05K 3/328* (2013.01); *H05K 1/142* (2013.01); *H05K 1/181* (2013.01); *H05K 3/4015* (2013.01); *H01L 2224/18* (2013.01)

(58) Field of Classification Search
CPC .... H05K 3/328; H05K 1/142; H05K 3/4015; H05K 1/181
USPC .......................... 174/257, 250, 253, 255–256
See application file for complete search history.

(56) References Cited

U.S. PATENT DOCUMENTS

| | | | |
|---|---|---|---|
| 3,670,394 A | 6/1972 | Daniels et al. | |
| 5,354,392 A | 10/1994 | Santo et al. | |

(Continued)

FOREIGN PATENT DOCUMENTS

| | | |
|---|---|---|
| CN | 101379894 A | 3/2009 |
| DE | 102008050798 | 4/2010 |

(Continued)

OTHER PUBLICATIONS

Japanese Office Action of Aug. 4, 2015 issued to a corresponding Japanese patent application.

(Continued)

*Primary Examiner* — Tremesha S Willis
(74) *Attorney, Agent, or Firm* — Jacobson Holman, PLLC.

(57) ABSTRACT

In a method for mounting an element or component having at least one metal surface in or on a circuit board containing at least one conducting layer made of metal material, a connection between the at least one metal surface of the element and the at least one conducting layer of the circuit board is formed using ultrasonic welding or high-frequency friction welding in order to create a mechanically stable and resistant connection or attachment having good conductivity. Furthermore, a circuit board is disclosed in which at least one element or component having a metal surface is or can be connected to a conducting or conductive layer of the circuit board using ultrasonic welding or high-frequency friction welding.

13 Claims, 2 Drawing Sheets

Figure 1A:
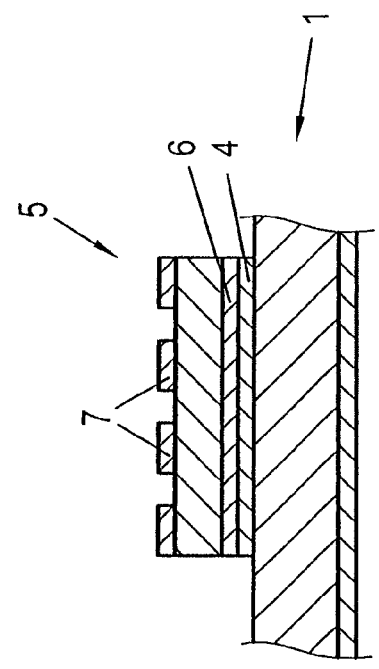

(51) Int. Cl.
*H05K 1/14* (2006.01)
*H05K 3/40* (2006.01)
*H05K 1/18* (2006.01)

(56) References Cited

U.S. PATENT DOCUMENTS

2006/0078715 A1 4/2006 Lu
2008/0150132 A1 6/2008 Hu et al.
2009/0314522 A1 12/2009 Janesch et al.

FOREIGN PATENT DOCUMENTS

| | | |
|---|---|---|
| JP | 2003-123733 A | 4/2003 |
| JP | 2009-272435 A | 11/2009 |
| TW | 200612534 A | 4/2006 |
| WO | 2007/087982 A1 | 8/2007 |

OTHER PUBLICATIONS

Chinese Office Action of May 6, 2015 issued to a corresponding Chinese patent application.

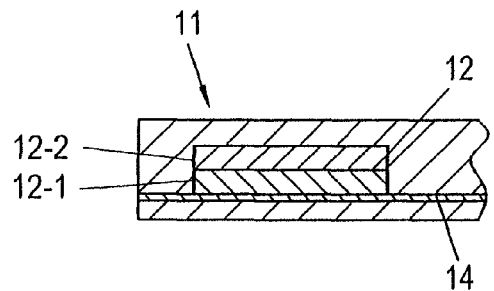
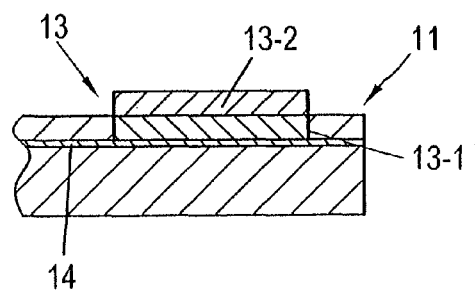
Fig. 2a    Fig. 2b
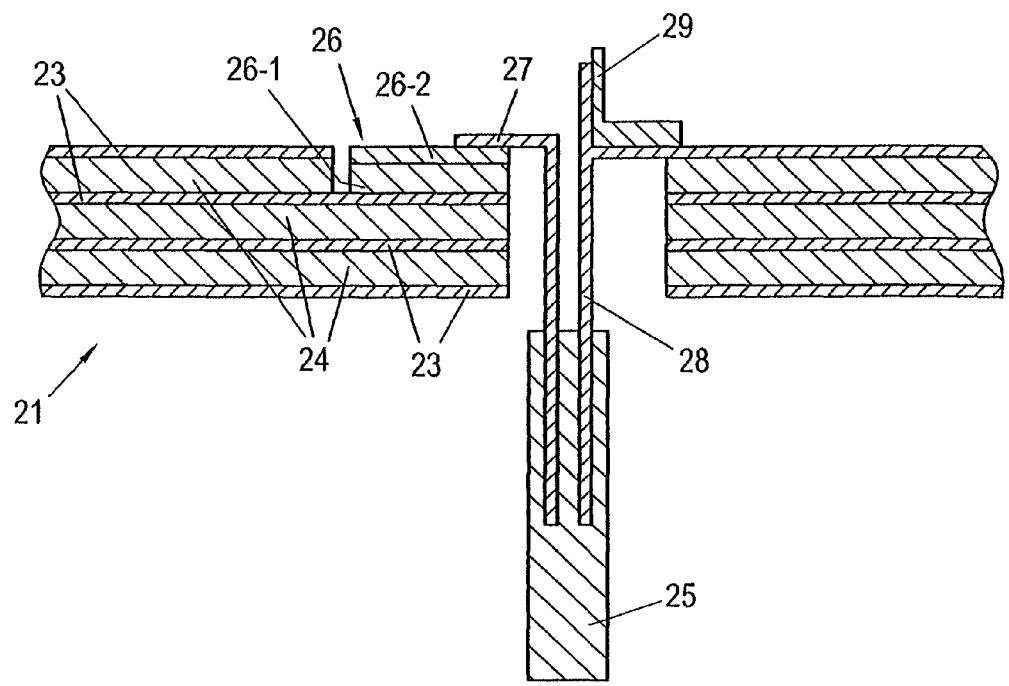
Fig. 3

METHOD FOR MOUNTING A COMPONENT IN OR ON A CIRCUIT BOARD, AND CIRCUIT BOARD

This is a national stage of PCT/AT2011/000464 filed Nov. 16, 2011 and published in German, which has priority of Austria no. GM 709/2010 filed Nov. 19, 2010, hereby incorporated by reference.

FIELD OF THE INVENTION

The present invention relates to a method for mounting an element or component having at least one metal surface in or on a circuit board containing at least one conducting layer made of metal material, and a circuit board containing at least one conducting layer made of metal material.

PRIOR ART

In the context of mounting an element or component having at least one metal surface in or on a circuit board, various methods such as soldering or gluing are known. The soldering of metal surfaces or conducting layers made of metal materials of a circuit board involves the drawback of requiring a comparatively high amount of work input. Moreover, soldering procedures are partly extremely complex, and partly almost inoperable, especially with planes or surfaces to be connected and consisting of different materials. When gluing such planes or surfaces to be connected, it is frequently disadvantageous that adhesive connections will not readily ensure or provide sufficient safety and strength under elevated or extended stress. Besides, a thermally or electrically well conducting adhesive connection is, for instance, not or not readily feasible even when using adhesives having special conductivities.

SUMMARY OF THE INVENTION

The present invention aims to avoid, or at least reduce, the problems of the known prior art involved in the connection of a metal surface of a component or element to be mounted in or on a circuit board and a conducting layer of a circuit board, wherein it is, in particular, aimed to enable the formation of a reliable and mechanically loadable connection providing proper conductivity.

To solve these objects, a method of the initially defined kind is essentially characterized in that a connection between the at least one metal surface of the element and the at least one conducting layer of the circuit board is formed using ultrasonic welding or high-frequency friction welding. The use of ultrasonic welding or high-frequency friction welding for connecting at least one metal surface of an element or component to be mounted in or on the circuit board and the at least one conducting layer of the circuit board, will not only provide a mechanically stable connection between the planes or surfaces to be connected to each other, but the produced connection will also ensure an appropriately good electrical and, if optionally required, thermal conductivity. In such ultrasonic welding or high-frequency friction welding operations, the heat required to make a connection is obtained by high-frequency mechanical oscillation resulting from the molecular and interfacial friction between the components or planes or surfaces to be connected. The necessary high-frequency oscillation is, for instance, provided by a sonotrode or a high-frequency oscillating head, with the oscillations being transmitted under pressure to the elements or components to be connected. In doing so, at least the surfaces of the elements to be connected to each other start to warm up by the resulting friction, yet the planes or surfaces of the components to be connected will not be heated until melting, and a connection of the planes or surfaces to be connected to each other will usually be substantially provided by the interlocking of the surfaces of the elements or surfaces to be connected to each other, in particular upon breaking of an oxide layer. It is possible to provide a mechanically safe connection of at least one conducting layer of the circuit board to the element or component to be connected thereto while treating with care the component or element to be connected to the circuit board as well as optionally existing structures of the circuit board.

In order to provide the desired conductivity and a mechanically stable connection, it is proposed according to a preferred embodiment that a substantially full-surface connection is formed between the metal surface of the element and the conducting layer of the circuit board.

When inserting an element or component into a circuit board and/or for embedding such an element or component, which may basically also be arranged on an external surface of a circuit board, it is proposed that an at least partial sheathing or embedment of the element connected to the conducting layer of the circuit board is formed after having connected the metal surface of the element and the conducting layer of the circuit board, as in correspondence with a further preferred embodiment of the method according to the invention.

While an element to be mounted in or on the circuit board may, for instance, serve to carry off heat or dissipate heat to a radiator or heat sink, the embedment or reception of components provided with additional contacts in or on a circuit board is frequently provided. For contact-connecting or bonding following mounting as provided by the invention using ultrasonic welding or high-frequency friction welding, it is proposed according to a further preferred embodiment that bonding of the element connected to the conducting layer of the circuit board is performed in a manner known per se, in particular after having formed the connection and, in particular, the sheathing or embedment of the element.

In addition to the direct coupling between an element or component and a conducting or conductive layer of a circuit board, it is, for instance, required, in order to establish a connection to an external component provided with connection sites or contacts formed of a material different from the material used for the conducting or conductive layer of the circuit board, to provide multilayer composite elements enabling the coupling of such different materials. In the context of the method according to the invention and in view of a mechanically stable connection having good conductivity between an element or component and a conducting or conductive layer of a circuit board, it is proposed according to a further preferred embodiment of the method according to the invention that the element is formed by a circuit board element containing, or consisting of, at least two layers or plies of different conducting materials, in particular metals. For coupling to an external element or component, it is proposed according to a further preferred embodiment that the metal surface, or a ply of the element mounted in or on the circuit board, is connected to an external component.

In this respect, it is proposed according to a further preferred embodiment, in particular in respect to optionally different materials or metals to be combined that the metal surface, or the at least one layer or ply, of the element mounted in or on the circuit board is selected from the group consisting of copper, aluminum, nickel, tin, zinc, titanium, silver, gold, palladium, vanadium, chromium, magnesium, iron, steel, stainless steel and indium as pure materials or alloy(s) thereof.

In order to ensure particularly reliable and good coupling to the conducting or conductive layer of the circuit board, it is, moreover, proposed that the element mounted in or on the circuit board is formed by a bi- or tri-metal substrate, wherein a layer of the element facing the at least one layer of conducting material of the circuit board is formed of copper or a Cu-containing alloy, as in correspondence with a further preferred embodiment of the method according to the invention.

For coupling to an external component or, for instance, a connection or contact site of such an external component, it is proposed according to a further preferred embodiment that a layer of the element facing away from the layer facing the at least one layer of conducting material of the circuit board is formed by a metal different from copper, in particular aluminum or an aluminum alloy.

In order to support a reliable and stable mechanical connection, in particular in circuit boards that are subjected to high temperature stresses and high temperature differences, and/or in order to avoid detachment or destruction of the connection at such different temperatures, it is proposed according to a further preferred embodiment that the circuit board element is formed by metals having high, substantially similar or identical, thermal conductivities.

To solve the above-defined objects, a circuit board containing at least one conducting layer made of metal material is essentially characterized in that the circuit board comprises an element or component having at least one metal surface, wherein the metal surface of the element or component is connected or connectable to the at least one conducting layer of the circuit board using ultrasonic welding or high-frequency friction welding. As already pointed out above, not only a mechanically stable connection to a metal surface of an element or component to be mounted in or on the circuit board, but also an appropriately good conductivity of such a connection will be provided in a reliable and simple manner.

In order to achieve a good mechanical strength of the connection and an optionally additionally required large connected surface area for providing the desired conductivity, it is proposed according to a further preferred embodiment that a substantially full-surface connection is provided between the metal surface of the element and the conducting layer of the circuit board.

In particular for coupling to external components optionally comprised of materials different from a material of a conducting or conductive layer of a circuit board, it is proposed according to a further preferred embodiment that the element is comprised of a circuit board element containing, or consisting of, at least two layers or plies of different conducting materials, in particular metals.

In order to ensure particularly reliable and good coupling to the at least one conducting or conductive layer of the circuit board, it is, moreover, proposed that the metal surface, or at least one layer or ply, of the element mounted in or on the circuit board is selected from the group consisting of copper, aluminum, nickel, tin, zinc, titanium, silver, gold, palladium, vanadium, chromium, magnesium, iron, steel, stainless steel and indium as pure materials or alloy(s) thereof, as in correspondence with a further preferred embodiment of the circuit board according to the invention.

For coupling to the conducting or conductive layer of the circuit board, it is proposed according to a further preferred embodiment that the element mounted in or on the circuit board is formed of a bi- or tri-metal substrate, wherein a layer facing a layer made of conducting material, of the circuit board is formed of copper or a Cu-containing alloy.

Particularly as a function of the material of the external component to be additionally coupled to the circuit board, it is, moreover, preferably proposed that a layer of the circuit board element facing away from the layer facing the at least one layer of conducting material of the circuit board is formed of a metal different from copper, in particular aluminum or an aluminum alloy.

In order to maintain a stable mechanical connection, in particular under varying temperature stresses and/or at high temperature differences, it is, moreover, proposed that the circuit board element is formed of metals having high, substantially similar or identical, thermal conductivities, as in correspondence with a further preferred embodiment of the circuit board according to the invention.

SHORT DESCRIPTION OF THE DRAWINGS

In the following, the invention will be explained in more detail by way of exemplary embodiments schematically illustrated in the accompanying drawing. Therein:

FIGS. 1a to 1d depict different steps of a method according to the invention for mounting a component or element in or on a circuit board to produce a circuit board according to the invention;

FIGS. 2a and 2b are schematic illustrations of the mounting of a multilayer element in or on a circuit board according to the invention, using the method of the invention; and FIG. 3 illustrates a modified embodiment of a circuit board according to the invention for coupling to an external energy supply, again using a multilayer element or component mounted to the circuit board according to the method of the invention.

DETAILED DESCRIPTION OF PREFERRED EMBODIMENTS

In FIG. 1, a subarea of a circuit board schematically denoted by 1 is each illustrated, the multilayer structure of the circuit board 1 being merely indicated by the provision of a conducting or conductive layer 2, an insulating or non-conducting layer 3 and a conducting or conductive layer 4, wherein an element or component 5 is to be connected to the subarea of the conducting or conductive layer 4 of the circuit board 1, as will be discussed in more detail below.

A correspondingly larger number of layer or plies may b provided for the circuit board 1 as a function of the purpose of use or an optionally provided production of the circuit board 1 in preceding production steps not illustrated in detail.

Figure 1B:
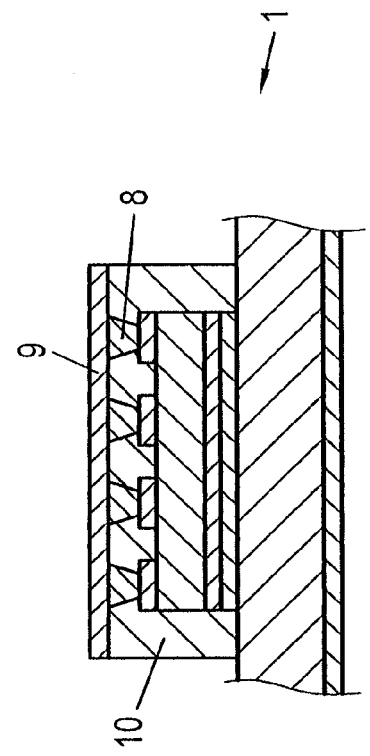

A connection between the conducting or conductive layer 4 of the circuit board 1 and the component or element 5 between the conducting or conductive layer 4 of the circuit board 1 and a metal surface 6 of the component 5 is made by ultrasonic welding or high-frequency friction welding. In doing so, an oscillation is applied by a sonotrode or a high-frequency oscillating head not illustrated in detail to the components or layers or surfaces 4 to be connected to each other, wherein an increase in the temperature of the layers 4 and 6 to be connected to each other is achieved by the molecular and interfacial friction generated by said oscillation. Such heating, which is usually not performed until melting of the surfaces 4 and 6 to be connected to each other, substantially causes interlocking of the surfaces 4 and 6 to be connected to each other, as is illustrated in FIG. 1b.

The high-frequency oscillating head may, for instance, be operated at a frequency of 20 kHz and, for instance, an excursion of 5 µm.

Friction welding or ultrasonic welding produces a reliable mechanical connection between the conducting or conductive layer 4 of the circuit board 1 and the metal surface or layer 6 of the component or element 5 to be coupled thereto, thus providing a safe mechanical connection between the layers 4 and 6 to be connected to each other and, for instance, also an electrically and thermally conductive connection.

Figure 1C:
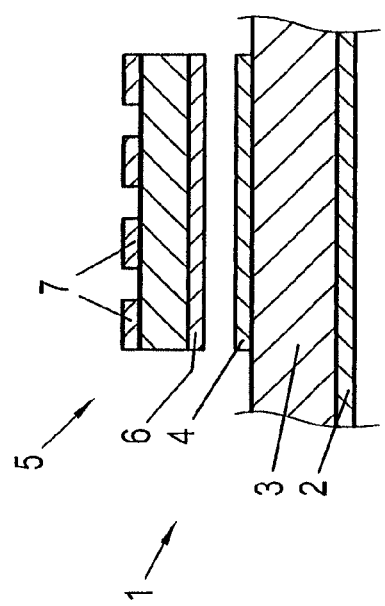
Figure 1D:
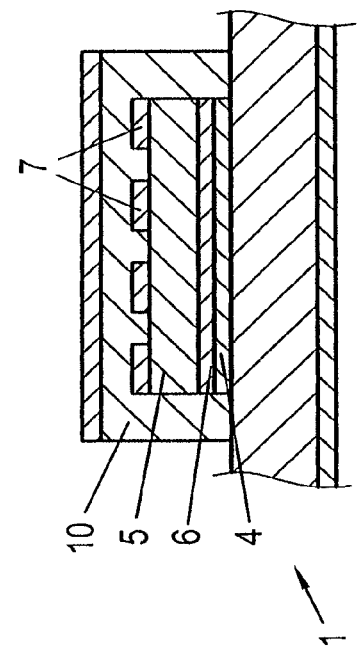

Following the mounting of the element or component 5, cladding or sheathing of the component 5 as illustrated in FIG. 1c is performed, in particular for the protection of the component 5, and optionally for embedment into further layers or plies of the circuit board 1, which are not illustrated in detail. In the illustrated embodiment, the component 5 is substantially completely sheathed by an insulating material 10, whereupon, after the formation of such a sheathing 10, bonding between contacts 7 of the component or elements 5 and contacts 8 is effected using an additional conducting layer or ply 9 of the circuit board 1.

By high-frequency friction welding or ultrasonic welding, it is thus possible to provide a mechanically stable and reliable connection of the surfaces 4 and 6, and an optionally required, appropriately high thermal and electrical conductivity.

FIGS. 2a and 2b each depict a modified embodiment of a circuit board denoted by 11.

An element each comprised of a multilayer circuit board element 12 or 13, respectively, is mounted on or in the circuit board 11, with a connection being each established via a schematically illustrated conducting or conductive layer 14, or a subarea thereof, of the circuit board 11. As is schematically indicated, the element or circuit board element 12 or 13 to be mounted in or on the circuit board 11 is comprised of different layers or plies 12-1 and 12-2 or 13-1 and 13-2, respectively, which are made of different conducting materials, in particular metals. The layers or plies 12-1 and 13-1 are, for instance, made of copper or a copper-containing alloy in order to obtain a connection to the conducting or conductive layer 14 of the circuit board 11 in a simple and reliable manner, such conducting or conductive layers 14 usually being made of copper.

For connecting a further, external component, as is, for instance, illustrated in FIG. 3, the layer or ply 12-2 of the circuit board element 12, or the layer 13-2 of the circuit board element 13, is made of a material different from copper or copper-containing material, such as, e.g., aluminum or an aluminum alloy, in order to be subsequently connected or coupled to an external component as will be discussed in detail below, in particular with reference to FIG. 3.

In the embodiment according to FIG. 2, the connection between the layer 12-1 or 13-1 to the conducting or conductive layer 14 of the circuit board 11 is produced by high-frequency friction welding or ultrasonic welding, thus again providing a mechanically stable connection having good conductivity.

FIG. 3 depicts a multilayer circuit board 21, wherein individual conducting layers or plies of the same are denoted by 23 and layers or plies located therebetween and made of non-conducting or insulating material are denoted by 24. For coupling to an energy supply, e.g. a battery 25, a multilayer element or circuit board element 26 is again provided for connection to an electrode 27 of the battery 25, while coupling to a second electrode 28 is realized via a solder joint or an L-shaped solder profile 29.

For coupling the electrode 27, which is made of aluminum or an aluminum alloy, the element or circuit board element 26 is again comprised of a layer or ply 26-1 of copper or copper-containing material and a layer or ply 26-2 of aluminum or aluminum-containing material, thus enabling in a simple and reliable manner the coupling or connection of the electrode 27 of aluminum to a conducting or conductive area 23 of the circuit board 21, whereas a mechanical connection, e.g. by soldering, between the copper layer 23 of the circuit board 21 and the electrode 27 of aluminum would not be feasible.

Instead of the solder joint 29 used for connecting or coupling to the electrode 28 made of or coated with, for instance, nickel, a further element or circuit board element could be integrated in the circuit board 21 in a manner similar to the multilayer circuit board element 26, wherein a first layer or ply of copper or copper-containing material is again connected to a conducting layer 23 of the circuit board 21, while for direct coupling to the electrode 28 made of or coated with nickel, the second layer or ply of such a multilayer circuit board element consists of nickel or nickel-containing material.

For a mechanically stable and well conducting or conductive connection, the mounting of a component or element 26 comprised of a multilayer circuit board element also in the embodiment according to FIG. 3 is performed by high-frequency friction welding or ultrasonic welding in a manner similar to the embodiment according to FIGS. 1a to 1d.

The following materials may be chosen as materials for the surfaces or metal layers of the component 5 and the layers or plies 12-1 and 12-2, 13-1 and 13-2, as well as 26-1 and 26-2, of the element or circuit board element 12, 13 or 26, respectively: copper, aluminum, nickel, tin, zinc, titanium, silver, gold, palladium, vanadium, chromium, magnesium, iron, steel, stainless steel and indium.

Instead of pure materials, alloys of the above-mentioned materials can also be used.

The selection of the materials used for the multilayer elements or circuit board elements 12, 13 or 26 is made, in particular, in view of the elements or subareas to be connected thereto, in the circuit board 11 or 21, respectively, as well as an external component 25 to be connected or coupled thereto, wherein, for instance, for such a multilayer circuit board element 12, 13 or 26, the following material combinations may be employed, the additional data referring to weight percent of such a multilayer circuit board element:
Aluminum—copper (80/20)
Aluminum—nickel (70/30)
Copper—nickel (60/40)
Copper—zinc (75/25)
Copper—nickel—copper (40/20/40)

In addition to the components or elements or external components illustrated in the Figures, such as the component or semiconductor component 5 or battery 15, it is, in particular, possible to effect coupling to, for instance, the following external or additional components, in particular via the multilayer circuit board elements 12, 13 or 26: Li-ion accumulators and film batteries with cell lugs made of aluminum and/or copper, semiconductor components such as ESD diodes, capacitors or the like which are, in particular, provided with aluminum end surfaces or aluminum contacts, cooling elements or, in general, devices for enhancing the thermal dissipation from a circuit board including, for instance, components with high dissipation heat levels such as LED, MOSFET or the like.

It is, moreover, possible, in particular when using multilayer elements or circuit board elements 12, 13 or 26, to perform coupling or connecting or mounting of the additional external component such as, e.g., the electrodes 27 or 28 of the battery 25 likewise by high-frequency friction welding or ultrasonic welding using suitable materials or material combinations of the electrodes and the metal surface to be connected thereto of the multilayer element or circuit board element in addition to coupling or connecting between the conducting or conductive layer 14 or 23 of the circuit board 11 or 21, respectively, and the facing metal surface 12-1, 13-1 or 26-1 of the component or element 12, 13 or 26, respectively, to be connected thereto and mounted in or on the circuit board.

The invention claimed is:

1. A method for mounting an element having at least one metal surface in or on a circuit board containing at least one conducting layer made of conducting material, wherein a connection between the at least one metal surface of the element and the at least one conducting layer of the circuit board is formed using ultrasonic welding or high-frequency friction welding, wherein the element mounted in or on the circuit board is formed by a bi- or tri-metal substrate, wherein a layer of the element facing the at least one conducting layer of the circuit board is formed by copper or a Cu-containing alloy, wherein a substantially full-surface connection is formed between the at least one metal surface of the element and the at least one conducting layer of the circuit board, wherein a further layer of the element facing away from the layer facing the at least one conducting layer of the circuit board is formed by a metal different from copper, wherein the method further comprises a step of connecting an energy supply to the further layer of the element facing away from the layer facing the at least one conducting layer of conducting material of the circuit board, wherein the further layer of the element is made of aluminum or an aluminum alloy.

2. The method according to claim 1, wherein the element is formed by metals having high, substantially similar or identical, thermal conductivities.

3. The method according to claim 1, wherein an at least partial sheathing or embedment of the element connected to the at least one conducting layer of the circuit board is formed after having connected the at least one metal surface of the element and the at least one conducting layer of the circuit board.

4. The method according to claim 1, wherein bonding of the element connected to the at least one conducting layer of the circuit board is performed after having formed the connection and a sheathing or embedment of the element.

5. The method according to claim 1, wherein the element is formed by a circuit board element containing, or consisting of, at least two layers or plies of different conducting materials.

6. The method according to claim 1, wherein the at least one metal surface or a ply of the element mounted in or on the circuit board is connected to an external component.

7. The method according to claim 1, wherein the at least one metal surface, or at least one layer or ply, of the element mounted in or on the circuit board is selected from the group consisting of copper, aluminum, nickel, zinc, titanium, silver, gold, palladium, vanadium, chromium, magnesium, iron, steel, stainless steel and indium as pure materials or alloy(s) thereof.

8. A circuit board containing at least one conducting layer made of conducting material, wherein the circuit board comprises an element or component having at least one metal surface, wherein the at least one metal surface of the element or component is connected or connectable to the at least one conducting layer of the circuit board using ultrasonic welding or high-frequency friction welding, wherein the element mounted in or on the circuit board is formed of a bi- or tri-metal substrate, wherein a layer of the element facing a layer of the at least one conducting layer of the circuit board is formed of copper or a Cu-containing alloy, and wherein a substantially full-surface connection is provided between the at least one metal surface of the element and the at least one conducting layer of the circuit board, wherein a further layer of a circuit board element facing away from the layer, facing the at least one layer of conducting material of the circuit board is formed of a metal different from copper, wherein an energy supply is to the further layer of the element facing away from the layer facing the at least one conducting layer of conducting material of the circuit board, wherein the further layer of the element is made of aluminum or an aluminum alloy.

9. The circuit board according to claim 8, wherein a circuit board element is formed of metals having high, substantially similar or identical, thermal conductivities.

10. The circuit board according to claim 8, wherein the element is comprised of a circuit board element containing, or consisting of, at least two layers or plies of different conducting materials.

11. The circuit hoard according to claim 8, wherein the at least one metal surface, or at least one layer or ply, of the element mounted in or on the circuit board is selected from the group consisting of copper, aluminum, nickel, zinc, titanium, silver, gold, palladium, vanadium, chromium, magnesium, iron, steel, stainless steel and indium as pure materials or alloy(s) thereof.

12. The method accosting to claim 5, wherein the at least two layers or plies are made of different metals.

13. The circuit board accosting to claim 10, wherein the at least two layers or plies are made of different metals.

* * * * *